US006775145B1

(12) United States Patent
Chen et al.

(10) Patent No.: US 6,775,145 B1
(45) Date of Patent: Aug. 10, 2004

(54) CONSTRUCTION FOR HIGH DENSITY POWER MODULE PACKAGE (CASE II)

(75) Inventors: Da-Jung Chen, Taoyuan (TW); Chin-Hsiung Liao, Chu-pei (TW)

(73) Assignee: Cyntec Co., Ltd., Hsinchu (TW)

( * ) Notice: Subject to any disclaimer, the term of this patent is extended or adjusted under 35 U.S.C. 154(b) by 0 days.

(21) Appl. No.: 10/437,238

(22) Filed: May 14, 2003

(51) Int. Cl.[7] .............................. H05K 1/14; H05K 7/20
(52) U.S. Cl. ..................... 361/728; 174/52.2; 174/52.1; 257/678; 361/715; 361/720
(58) Field of Search .................. 361/728–730, 361/752, 726, 702, 704, 709, 711, 707, 713, 715, 719, 720, 701, 733, 736; 257/701, 678, 787; 174/50, 52.1, 52.2

(56) References Cited

U.S. PATENT DOCUMENTS 5,057,906 A * 10/1991 Ishigami ..................... 257/706
5,077,595 A * 12/1991 Fukunaga ................... 257/659
5,398,160 A * 3/1995 Umeda ....................... 361/707
5,559,374 A * 9/1996 Ohta et al. .................. 257/723
5,721,455 A * 2/1998 Takashita .................... 257/713
5,736,786 A * 4/1998 Sankaran et al. ........... 257/717
5,942,797 A * 8/1999 Terasawa .................... 257/723
6,060,772 A * 5/2000 Sugawara et al. .......... 257/678
6,272,015 B1 * 8/2001 Mangtani .................... 361/707
6,291,886 B1 * 9/2001 Sonoda et al. .............. 257/751
6,344,973 B1 * 2/2002 Feustel et al. .............. 361/760
6,421,244 B1 * 7/2002 Shinohara et al. .......... 361/736
6,574,107 B2 * 6/2003 Jeon et al. ................... 361/709

* cited by examiner

Primary Examiner—David Martin
Assistant Examiner—Dameon E. Levi
(74) Attorney, Agent, or Firm—Troxell Law Office PLLC

(57) ABSTRACT

A high density power module package where in the circuits and a part of chips of the power module are formed on respective substrates such that the circuit patterns are not influenced by the chips. Accordingly, the density of the circuit can be improved so as to save the required area of substrate and production cost.

12 Claims, 4 Drawing Sheets

CONSTRUCTION FOR HIGH DENSITY POWER MODULE PACKAGE (CASE II)

BACKGROUND OF THE INVENTION

1. Field of the Invention

The present invention relates to a newly designed power module package, and more particularly to a high density power module package which is characterized in having the property of high heat dissipation, easy to fabricate the lead frame, and low production cost.

2. Description of the Prior Art

The conventional power module packages can be classified in three categories, namely:

(1) The first one is shown in FIG. 1A and FIG. 1B, wherein a high heat dissipation substrate 100 made of a high molecular insulation layer and a metal foil layer is prepared as a base substrate. All power pack module circuits and a plurality of chips 101, 102, 103 . . . are fabricated on the surface of the substrate 100. After that the module circuits and lead frames 121, 122, or the chips 101, 102 . . . and the lead frames 121, 122 . . . are electrically connected by wires 111, 113 . . . or by wires 112 . . . respectively utilizing wire bonding technique.

No matter how simple and easy to fabricate, the structure of the above described power module package has the following shortcomings:

1. Density of the power pack module circuits cannot be raised by reason that all the power pack module circuits and the chips are fabricated on the same substrate.
2. The foregoing shortcoming, described in § 1 calls for a larger substrate to compensate for that leads to increasing the production cost.
3. The instantaneous heat conduction ability is poor since heat conduction relies only on the heat dissipation paste applied between the substrate 100 and the heat sink (not shown) which is formed on the outer surface of the substrate 100 for dissipating heat produced by those chips 101, 102 . . . on the power pack module circuits and being conducted to the substrate 100.

(2) The second example is shown in FIG. 2A and FIG. 2B, wherein a metal plate 200 is further attached to the bottom surface of the high heat dissipation substrate 100 for fabricating all the power pack module circuits and attaching chips 101, 102, 103 . . . on the substrate 100. Thereafter, the module circuits and the lead frames 121, 122, or the chips 101, 102 . . . and the lead frames 121, 122 . . . are electrically connected by wires 111, 113 . . . , or wires 112 . . . respectively utilizing wire bonding technique.

No matter how simple and easy to fabricate, and how advantageous in better heat dissipation by the metal plate 200 attached to the bottom surface of the substrate 100, the above-mentioned structure is unable to be released from the following shortcomings:

1. Density of the power module circuits cannot be raised by reason that all the power module circuits and the chips are fabricated on the same substrate.
2. The foregoing shortcoming described in § 1 calls for a larger substrate for remedy that leads to increasing the production cost.

(3) The third example is shown in FIG. 3A and FIG. 3B, wherein the lead frames 121, 122 . . . are directly patterned on a metal substrate 200 integrally with the power module circuits and the chips 101, 102 . . . are also directly welded to (or using other means) to the lead frames. With this structure, there is established a heat conduction route for chips 101, 102 . . . lead frames 121, 122 . . . → thin wall of the package material→ metal plate 200 → heat sink.

No matter how simple and( easy to fabricate, the structure of the above described power module package has the following shortcomings:

1. The density and precision of both circuits and overall structure of the power module package is restricted by reason that the lead frames and overall circuit patterns are integrally formed in one piece.
2. Efficiency of heat dissipation is limited by the fact that heat conduction of chips shall be en route to the metal plate by way of the package material.

In order to solve the above described problems, the present inventor carried out theoretical studies and simulating experiments. Based on these studies and researches, the present invention came to propose the present invention.

SUMMARY OF THE INVENTION

Accordingly, it is a first object of the present invention to provide a power module package in which the circuit density can be improved.

To achieve this object, the circuits are formed on a printed circuit board which is attached to lead frames, and chips are welded to the lead frames so that existence of the chips never affects the layout of the circuit pattern thereby improving the circuit density.

It is a second object of the present invention to provide a power pack module package whose substrate area is reduced to save the production cost.

To achieve this object, the circuit density of this power module package is raised.

It is a third object of the present invention to provide a power module package which has an excellent heat conducting property.

To achieve this object, a metal plate is attached to the rear side of the lead frame with a very thin insulation layer being intercalated therebetween such that the heat generated by the chips are rapidly and efficiently dissipated from the metal plate without being en route to the metal plate by way of the poor thermal conductive package material.

It is a fourth object of the present invention to provide a power module package which is able to withstand a very high temperature caused by an instantaneous huge current.

To achieve this object, the lead frames on the substrate are arranged in a planar configuration so as to facilitate heat conduction and assure a sufficient creepage distance thereby degree of product safety is greatly increased.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENTS

The structures, advantages, and disadvantages concerning three examples of conventional power pack modules have been already described above, therefore, it is not necessary to discuss again.

Figure 1A:
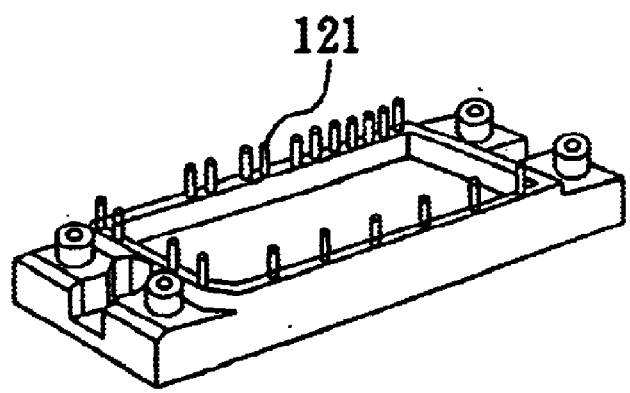
FIG. 1A is a three dimensional view of a conventional power module.
Figure 1B:
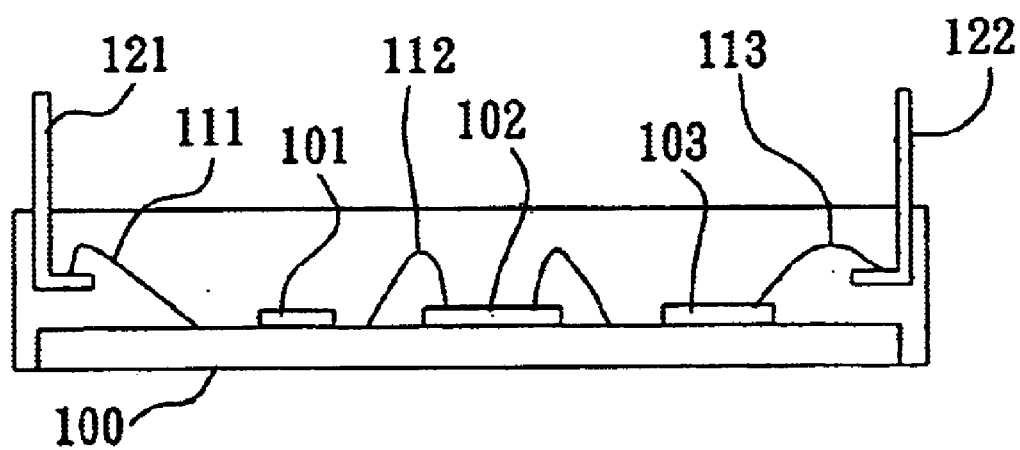
FIG. 1B is a longitudinal cross sectional view of FIG. 1A.
Figure 2A:
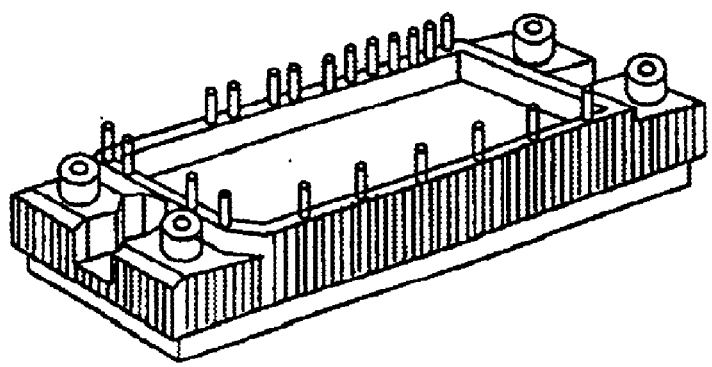
FIG. 2A is a three dimensional view of another conventional power module.
Figure 2B:
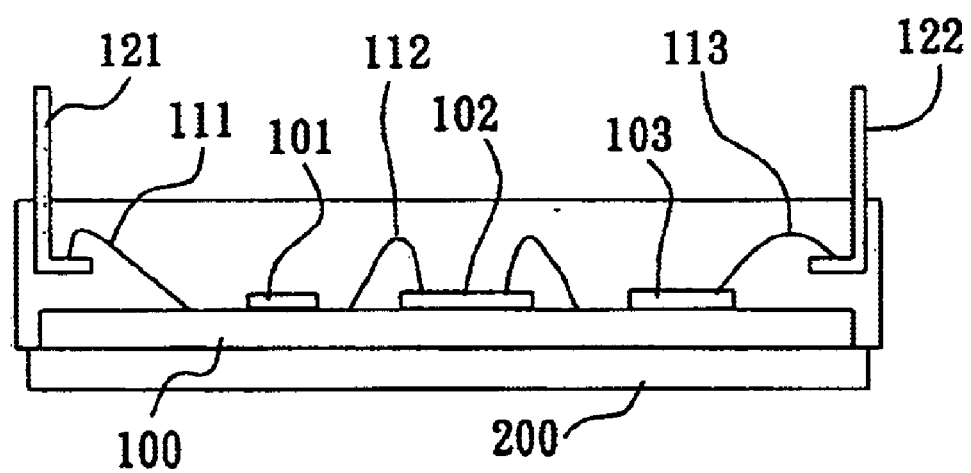
FIG. 2B is a longitudinal cross sectional view of FIG. 2A.
Figure 3A:
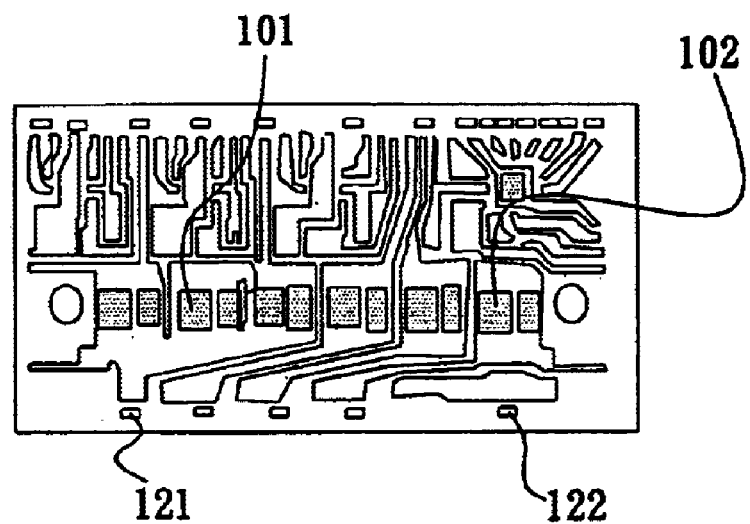
FIG. 3A is a schematic view showing the circuit layout pattern of one more example of a conventional power module.
Figure 3B:
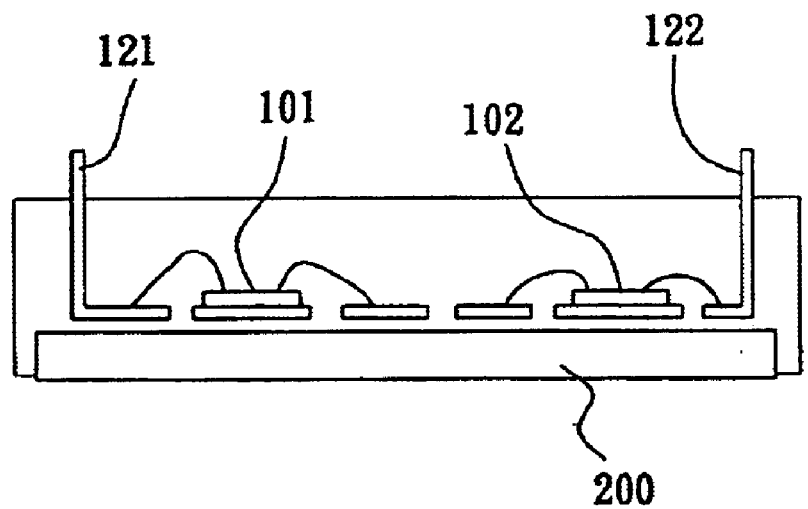
FIG. 3B is a longitudinal cross sectional view of FIG. 3A.
Figure 4A:
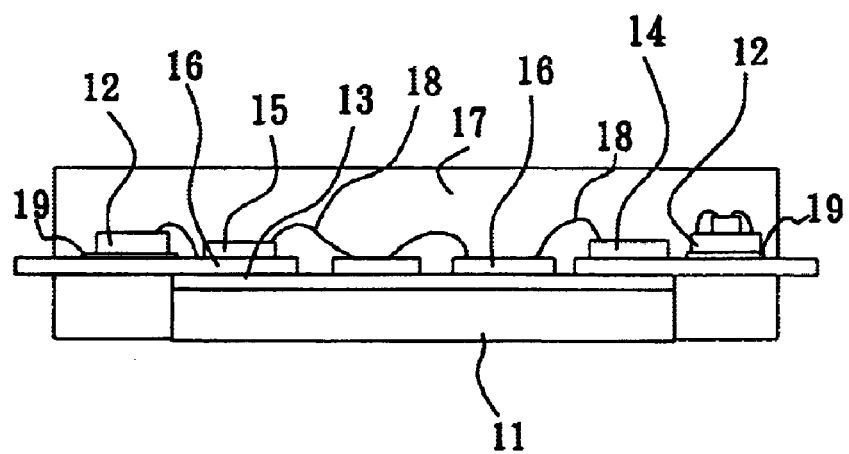
FIG. 4A is a plan view of a power module package of the present invention.
Figure 4B:
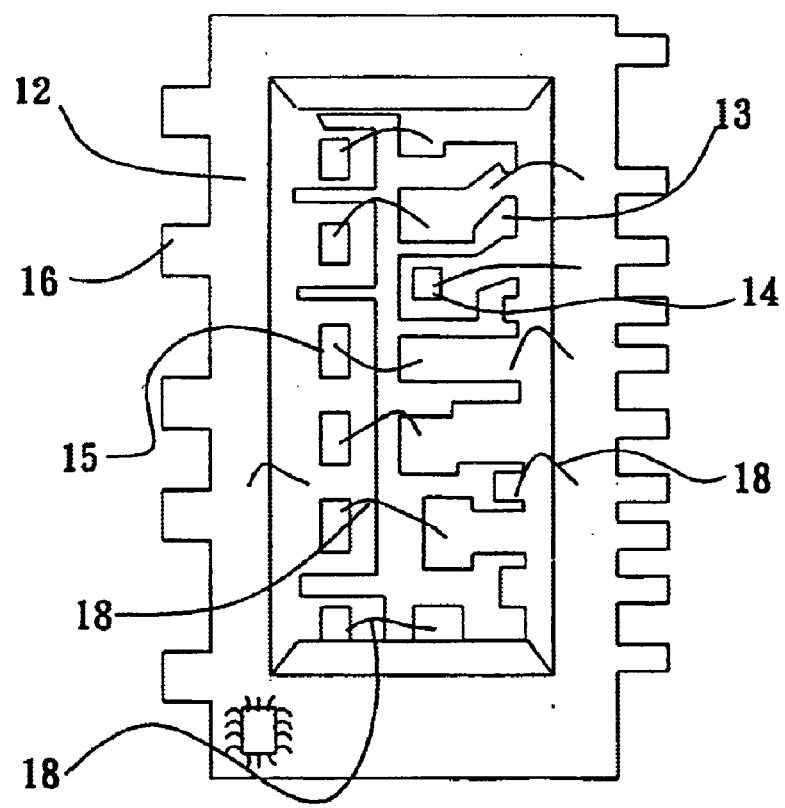
FIG. 4B is a longitudinal cross sectional view of FIG. 4A.

Referring to FIG. 4A and 4B, the power module package of the present invention is composed of a metal plate 11, a pair of printed circuit boards (PCB) 12, an insulation layer 13, a plurality of chips 14, 15 . . . , a plurality of lead frames 16, and a package material 17. The metal plate used as a substrate and a heat dissipation plate as well can be made of copper or aluminum. The PCB12 concentrates circuit patterns of the power pack module on it. Insulation layer 13 is preferably a high heat dissipation thin plate made of a high molecular insulation layer or a ceramic insulation layer and attached with a metal foil layer on each surface. The chips 14, 15 . . . are essentially fixed on the lead frames 16, or partially fixed on a portion of the PCBS12. The lead frames 16 are in contact with the PCBS12 using a conductive glue 19. In fabricating the power module described above, at first the circuit of the power module is formed on the PCB12; and then the PCB12 and chips 14, 15 . . . are fixed on the lead frame 16 at a preset position; afterwards, the lead frame 16 is first adhered to the insulation layer 13, and then adhered on the metal plate 11; then put into a housing, by pressure welding the wires 18 connecting the lead frames 16 and the PCB12, and the wires 18 connecting the lead frames 16 and the chips 14, 15, and then the structure is finished with a packaging material 17 a power module having a power module package of a power pack module of the present invention is obtained.

As it will be understood front the above description, the structure of the power module package according to the present invention is characterized in that the insulation layer 13 is a very thin high heat dissipation layer made of a high molecular insulation layer or a ceramic insulation layer attached with a metal foil layer on each surface. As a result, the cost of substrate material used is greatly reduced compared with that of any conventional one. Moreover, the design of overall circuits formed on the PCBS12 contributes to improving the density and precision of the power pack module structure. Besides, the circuits and the chips are attached to the lead frames 16 which are already attached to the insulation layer 13 of the metal plate 11. By doing so, an excellent thermal conductivity is obtained which makes the structure being able to withstand a high temperature generated from a large instantaneous current and to have a sufficient creepage distance thereby greatly improving safety of the product.

From the above description, it is clearly understandable that the high density power module package of the present invention comprises the functions of increasing the circuit density and accuracy, excellent heat dissipation, low manufacturing cost and more secure in operation. These functions would improve the shortcomings happened in conventional power modules. It is an invention which is worthy for industrial utilizations.

Those who are skilled in the art will readily perceive how to modify the invention. Therefore the appended claims are to be construed to cover all equivalent structures which fall within the true scope and spirit of the invention.

What is claimed is:

1. A high density power module package comprising:
   a) a power module structure having:
      i) a heat dissipating metal plate;
      ii) an insulation layer connected to the heat dissipating metal plate, the insulation layer comprising a high heat dissipation thin plate;
      iii) a plurality of spaced apart lead frames connected to the insulation layer such that the insulation layer is located between the plurality of lead frames and the heat dissipating metal plate;
      iv) two printed circuit boards having circuit patterns, each printed circuit board connected to one of the plurality of lead frames by a conductive glue; and
      v) a plurality of chips, each of the plurality of chips connected to one of the lead frames and the printed circuit boards, wherein the plurality of lead frames, the plurality of chips, and the printed circuit boards are electrically connected; and
   b) a packaging material encasing the power module structure.

2. The high density power module package according to claim 1, wherein each of two of the plurality of lead frames are electrically connected to the circuit patterns on one of the two printed circuit boards.

3. The high density power module package according to claim 1, wherein the plurality of lead frames, the plurality of chips, and the printed circuit boards are electrically connected by connecting wires.

4. The high density power module package according to claim 1, wherein the plurality of lead frames and the insulation layer are connected to one surface of the metal plate.

5. The high density power module package according to claim 1, wherein the insulation layer is a material selected from a group consisting of a high molecular insulation layer and a ceramic insulation layer.

6. The high density power module package according to claim 5, further comprising a metal foil layer on surfaces of the insulation layer.

7. A high density power module package comprising:
   a) a power module structure having:
      i) a heat dissipating metal plate;
      ii) an insulation layer connected to the heat dissipating metal plate, the insulation layer comprising a high heat dissipation thin plate;
      iii) at least one lead frame connected to the insulation layer such that the insulation layer is located between the at least one lead frame and the heat dissipating metal plate;
      iv) at least one circuit board having circuit patterns and connected to one of the at least one lead frame by a conductive glue; and
      v) a plurality of chips, each of the plurality of chips connected to one of the at least one lead frame and the at least one printed circuit board, wherein the at least one lead frame, the plurality of chips, and the at least one printed circuit board are electrically connected; and
   b) a packaging material encasing the power module structure.

8. The high density power module package according to claim 7, wherein each of the at least one lead frame is electrically connected to the circuit patterns on one of the two printed circuit boards.

9. The high density power module package according to claim 7, wherein the at least one lead frame, the plurality of chips, and the at least one printed circuit board are electrically connected by connecting wires.

10. The high density power module package according to claim 7, wherein the at least one lead frame and the insulation layer are connected to one surface of the metal plate.

11. The high density power module package according to claim 7, wherein the insulation layer is a material selected from a group consisting of a high molecular insulation layer and a ceramic insulation layer.

12. The high density power module package according to claim 11, further comprising a metal foil layer on surfaces of the insulation layer.

* * * * *